(12) United States Patent
Sekine et al.

(10) Patent No.: US 7,537,378 B2
(45) Date of Patent: May 26, 2009

(54) WIRE DISCONNECTION INSPECTING DEVICE AND METHOD

(75) Inventors: Keita Sekine, Saitama (JP); Kazuyuki Fukamachi, Utsunomiya (JP); Katsumi Takeishi, Fujimino (JP); John Cheek, Mechanicsburg, OH (US)

(73) Assignee: Honda Motor Co., Ltd, Tokyo (JP)

( * ) Notice: Subject to any disclaimer, the term of this patent is extended or adjusted under 35 U.S.C. 154(b) by 182 days.

(21) Appl. No.: 11/791,617

(22) PCT Filed: Nov. 25, 2005

(86) PCT No.: PCT/JP2005/021733

§ 371 (c)(1),
(2), (4) Date: May 25, 2007

(87) PCT Pub. No.: WO2006/057364

PCT Pub. Date: Jun. 1, 2006

(65) Prior Publication Data

US 2008/0143338 A1     Jun. 19, 2008

(30) Foreign Application Priority Data

Nov. 26, 2004   (JP) .............................. 2004-342789
Nov. 26, 2004   (JP) .............................. 2004-342964

(51) Int. Cl.
*G01N 25/00*    (2006.01)
*G01J 5/00*     (2006.01)
*G01K 13/00*    (2006.01)
*G01R 31/00*    (2006.01)

(52) U.S. Cl. ........................... 374/5; 374/141; 374/121; 374/57; 324/505; 250/341.6

(58) Field of Classification Search ............... 374/4, 374/5, 45, 57, 121; 324/505; 250/341.6
See application file for complete search history.

(56) References Cited

U.S. PATENT DOCUMENTS

| 6,614,922 | B1 * | 9/2003 | Walton ........................ 382/141 |
| 7,019,275 | B2 * | 3/2006 | Stam et al. ................ 250/208.1 |
| 2003/0219059 | A1 * | 11/2003 | Scott .............................. 374/5 |
| 2004/0124358 | A1 * | 7/2004 | Okamura et al. ......... 250/341.1 |
| 2005/0063449 | A1 * | 3/2005 | Lustenberger ................. 374/4 |
| 2006/0196865 | A1 * | 9/2006 | Weiss ........................ 219/203 |

FOREIGN PATENT DOCUMENTS

| JP | 58-047274 A | 3/1983 |
| JP | 63-32062 Y2 | 8/1988 |
| JP | 06-249905 A | 9/1994 |
| JP | 07-151810 B2 | 6/1995 |
| JP | 2003-215081 A | 7/2003 |
| JP | 2004-109038 A | 4/2004 |

* cited by examiner

*Primary Examiner*—Gail Verbitsky
*Assistant Examiner*—Mirellys Jagan
(74) *Attorney, Agent, or Firm*—Arent Fox LLP

(57) ABSTRACT

A wire disconnection inspecting device includes a vehicle position recognition unit for detecting that a vehicle has reached an inspection position; a preparation timing recognition unit for detecting that a step preceding by one is reached; a terminal for transmitting an operation signal to an ECU so as to make an electrical connection to a heating conductor; an infrared camera for imaging a rear shield of the vehicle; and a main processing unit for acquiring thermal image data from the infrared camera and inspecting disconnection of the heating conductor. The main processing unit recognizes that the vehicle has reached a step preceding by one according to the preparation timing recognition unit and makes electrical connection to the heating conductor via the terminal. The main processing unit acquires the image data from the infrared camera when the vehicle has reached the inspection position.

7 Claims, 13 Drawing Sheets

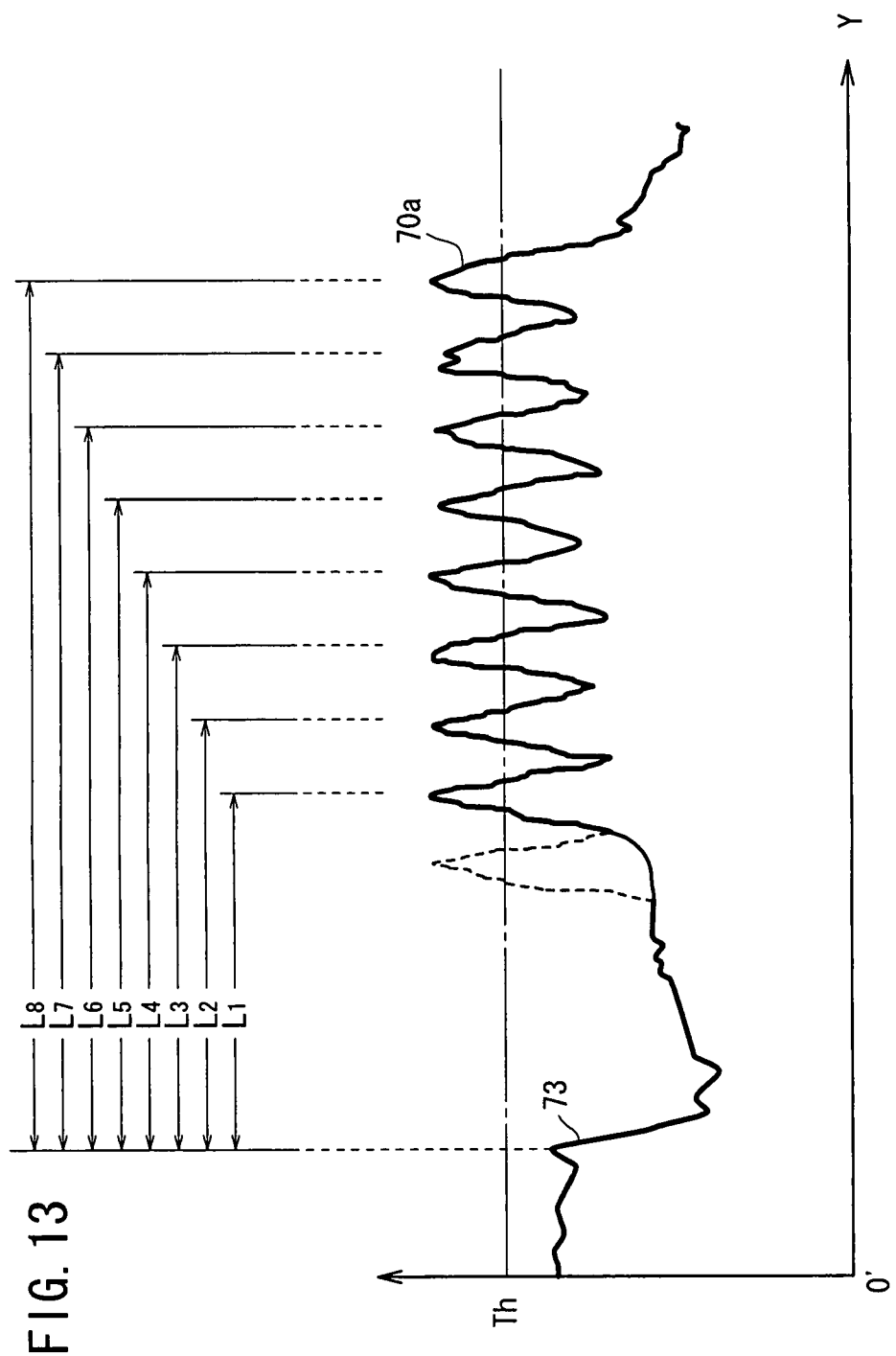

WIRE DISCONNECTION INSPECTING DEVICE AND METHOD

CROSS-REFERENCE TO RELATED APPLICATION

This application is a [National Stage entry of International Application No. PCT/JP2005/021733, filed Nov. 25, 2005, the entire specification claims and drawings of which are incorporated herewith by reference.

TECHNICAL FIELD

The present invention relates to a wire disconnection inspecting device and a wire disconnection inspecting method for inspecting whether a defogging and defrosting heater conductor on a glass panel of a vehicle is conductive or disconnected after the vehicle has been assembled.

BACKGROUND ART

Many vehicles have a defogging and defrosting heater conductor on their rear windshields (glass panels). Such a heater conductor needs to be inspected to confirm that it is not disconnected when the vehicle is manufactured and assembled.

There has been proposed a method of inspecting a heater conductor by passing an electric current through the heater conductor under given conditions and determining whether the heater conductor is conductive or disconnected from a temperature distribution of a thermal image that is obtained when the rear windshield is imaged by an infrared camera (see, for example, Japanese Laid-Open Patent Publication No. 2003-215081 and Japanese Laid-Open Patent Publication No. 2004-109038). According to the inspecting method, when a wire disconnection is to be determined, the thermal image data produced by the infrared camera is compared with configurational data of a reference heater conductor on a two-dimensional basis to identify a disconnected location.

The inspecting method is directed to the inspection of only the rear windshield. Actually, after a rear windshield is mounted on a vehicle, it is necessary to provide a systematic quality guarantee covering electric parts that include a defroster switch, a harness, etc. Therefore, the heater conductor on the completed vehicle is inspected again for a wire disconnection on a final inspection line. On the inspection line, it is customary for the inspector to turn on the defroster switch and then, after a given time has elapsed, to directly touch the surface of the rear windshield to confirm a temperature rise thereof.

Since it takes some time for the heater conductor to become heated, the inspector needs to turn on the defroster switch prior to the inspection of the heater conductor. This process is burdensome for the inspector. If the inspector forgets to turn on the defroster switch or operates the defroster switch improperly, then the heater conductor remains to be at the normal temperature when it is to be inspected. At this time, the inspector has to turn on the switch and wait until the heater conductor becomes heated, which is an inefficient sequence of operation.

According to the method of comparing the thermal image data produced by the infrared camera with the configurational data of the reference heater conductor on the two-dimensional basis as disclosed in Japanese Laid-Open Patent Publication No. 2003-215081 and Japanese Laid-Open Patent Publication No. 2004-109038, it is difficult to automatically spot the disconnected location, and part of the process needs to be visually judged by the inspector.

According to the inspection for a wire disconnection using the infrared camera, since it takes some time for the heater conductor to become heated, the defroster switch may be turned on to heat the heater conductor in another inspection process prior to the inspection of the heater conductor, and the infrared camera may capture an image of the rear windshield when the vehicle arrives at the process of the inspection for a wire disconnection.

Depending on how the inspection processes are performed, the inspection line may progress at different speeds, and the time required from the other prior inspection process to the wire disconnection inspection process may suffer fluctuations. In addition, depending on the state of the battery connected to the heater conductor, the voltage supplied by the battery may differ, and the temperature rise of the heater conductor may not necessarily be constant. Consequently, according to the method of comparing the thermal image data produced by the infrared camera with the configurational data of the reference heater conductor on the two-dimensional basis as disclosed in Japanese Laid-Open Patent Publication No. 2003-215081 and Japanese Laid-Open Patent Publication No. 2004-109038, the data may be matched to different degrees, and no stable inspection may not be performed.

The temperature rise of the heater conductor tends to differ depending on the season and the temperature difference between morning and evening time zones even at a constant time after the defroster switch is turned on. Therefore, the inspection may be inaccurate when the thermal image data produced by the infrared camera is processed in a fixed uniform way.

DISCLOSURE OF THE INVENTION

It is an object of the present invention to provide a wire disconnection inspecting device for automating a process of inspecting a heater conductor on a rear windshield for a wire disconnection after the vehicle is assembled, thereby preventing an inspection efficiency from being lowered by a human-induced error.

Another object of the present invention is to provide a wire disconnection inspecting method for inspecting a heater conductor accurately by suitably addressing different heated states of the heater conductor and environmental changes.

According to the present invention, a wire disconnection inspecting device for inspecting a heater conductor on a glass panel of a vehicle after the vehicle has been assembled, includes a vehicle position recognizing unit for detecting the arrival of the vehicle at a prescribed inspection position, a preparation timing recognizing unit for detecting a preparation timing which is a prescribed distance and/or a prescribed time before the vehicle reaches the prescribed inspection position, a terminal unit, which is connected to an electronic control unit mounted on the vehicle for controlling energization of the heater conductor, for sending an operation signal to the electronic control unit to energize the heater conductor, an infrared camera for capturing an image of the glass panel of the vehicle which has reached the inspection position, and an inspection unit connected to the vehicle position recognizing unit, the preparation timing recognizing unit, and the terminal unit, for acquiring a thermal image from the infrared camera and inspecting the heater conductor for a wire disconnection based on the thermal image, wherein the inspection unit controls the terminal unit to start energizing the heater conductor when the preparation timing recognizing unit recognizes the preparation timing, and acquires the thermal image from the infrared camera when the vehicle position recognizing unit recognizes the arrival of the vehicle at the inspection position. The connection between the inspection unit, and the vehicle position recognizing unit, the preparation timing recognizing unit, the terminal unit and the infrared camera may be wired or wireless.

As described above, when the preparation timing recognizing unit detects a preparation timing, the heater conductor is automatically energized through the terminal unit. When the vehicle reaches the inspection position and the infrared camera captures an image of the rear windshield of the vehicle, the heater conductor has been heated to an appropriate temperature. Therefore, the image can be captured and the heater conductor can be inspected for a wire disconnection without an undue wait time. Therefore, the process is efficient, no human-induced error is involved, and a reliable wire disconnection inspection is possible.

The heater conductor may comprise a circuit of a plurality of parallel lines extending in a predetermined direction on the glass panel. The inspection unit may establish an inspection window on the thermal image, the inspection window including a vehicle end and at least a portion of each of the parallel lines of the circuit, generate projection data by projecting and adding temperature data in the inspection window per unit column in the predetermined direction, count the number of parallel lines which are energized from areas having the projection data equal to or higher than a threshold value, and, if the number is smaller than a prescribed value, determine distances up to the areas equal to or higher than the threshold value from an area representing the vehicle end of the projection data, and compare the distances with respective prescribed distances to determine a location where a wire disconnection has occurred.

The inspection window thus established limits a processing range for a reduced inspection time and eliminates unnecessary portions of the thermal image for an accurate inspection. By generating the projection data from the temperature data in the inspection window, the number of energized lines of the circuit of the heater conductor can automatically be counted, and hence locations where a wire disconnection has occurred in the circuit can be identified based on a distance from the vehicle end in the inspection window.

According to the present invention, a wire disconnection inspecting method comprises the steps of connecting a terminal unit to an electronic control unit mounted on a vehicle, detecting a preparation timing which is a prescribed distance and/or a prescribed time before the vehicle reaches a prescribed inspection position, for a predetermined inspection unit to start energizing a heater conductor on a glass panel of the vehicle through the terminal unit, and, when the arrival of the vehicle at the prescribed inspection position is detected, controlling the inspection unit to acquire a thermal image of the glass panel captured by an infrared camera and processing the thermal image to inspect the heater conductor for a wire disconnection.

The heater conductor may comprise a circuit of a plurality of parallel lines extending in a predetermined direction on the glass panel, and the wire disconnection inspecting method may comprising the step of controlling the inspection unit to establish an inspection window on the thermal image, the inspection window including at least a portion of each of the parallel lines of the circuit and a vehicle end, generate projection data by projecting and adding temperature data in the inspection window per unit column in the predetermined direction, count the number of parallel lines which are energized from areas having the projection data equal to or higher than a threshold value, and, if the number is smaller than a prescribed value, determine distances up to the areas equal to or higher than the threshold value from an area representing the vehicle end of the projection data, and compare the distances with respective prescribed distances to determine a location where a wire disconnection has occurred.

The wire disconnection inspecting method may comprise the steps of setting an upper limit value of a color scale for converting the thermal image for display to a maximum temperature in an image processing range in the thermal image and setting a lower limit value of the color scale to a minimum temperature in the image processing range, converting colors of the thermal image based on the color scale, extracting component values of colors including red, green, and blue per pixel from the color-converted thermal image, inspecting the heater conductor for a wire disconnection based on the extracted component values of the colors.

Since the upper and lower limit values of the color scale are set based on the maximum and minimum temperatures in the image processing range and the colors of the thermal image obtained from the infrared camera are converted based on the color scale, the image of the heater conductor is appropriately identified for an accurate inspection regardless of different heated states of the heater conductor and environmental changes. The color-converted thermal image allows the image of the heater conductor to be easily identified when the inspector visually confirms the image.

The heater conductor may comprise a circuit of a plurality of parallel lines extending in a predetermined direction on the glass panel, and the wire disconnection inspecting method may comprise the steps of establishing an inspection window on the thermal image, the inspection window including at least a portion of each of the parallel lines of the circuit, generating projection data by projecting and adding the component values of the colors in the inspection window per unit column in the predetermined direction, and inspecting the heater conductor for a wire disconnection based on the projection data. The inspection window thus established limits a processing range for a reduced inspection time and eliminates unnecessary portions of the thermal image for an accurate inspection. By generating the projection data, the number of energized lines of the circuit of the heater conductor can automatically be counted.

Furthermore, the heater conductor may comprise a circuit of a plurality of parallel lines extending in a predetermined direction on the glass panel, and the wire disconnection inspecting method may comprise the steps of establishing an inspection window including at least a portion of each of the parallel lines of the circuit, as an image processing range, and setting the upper limit value of the color scale to a maximum temperature in the inspection window. Color scaling is performed based on relative high-temperature areas and low-temperature areas in the inspection window to provide a wide dynamic range for increased inspection accuracy.

BRIEF DESCRIPTION OF THE DRAWINGS

FIG. 13 is a diagram showing projection data produced when a first heater conductor is disconnected.

BEST MODE FOR CARRYING OUT THE INVENTION

Figure 1:
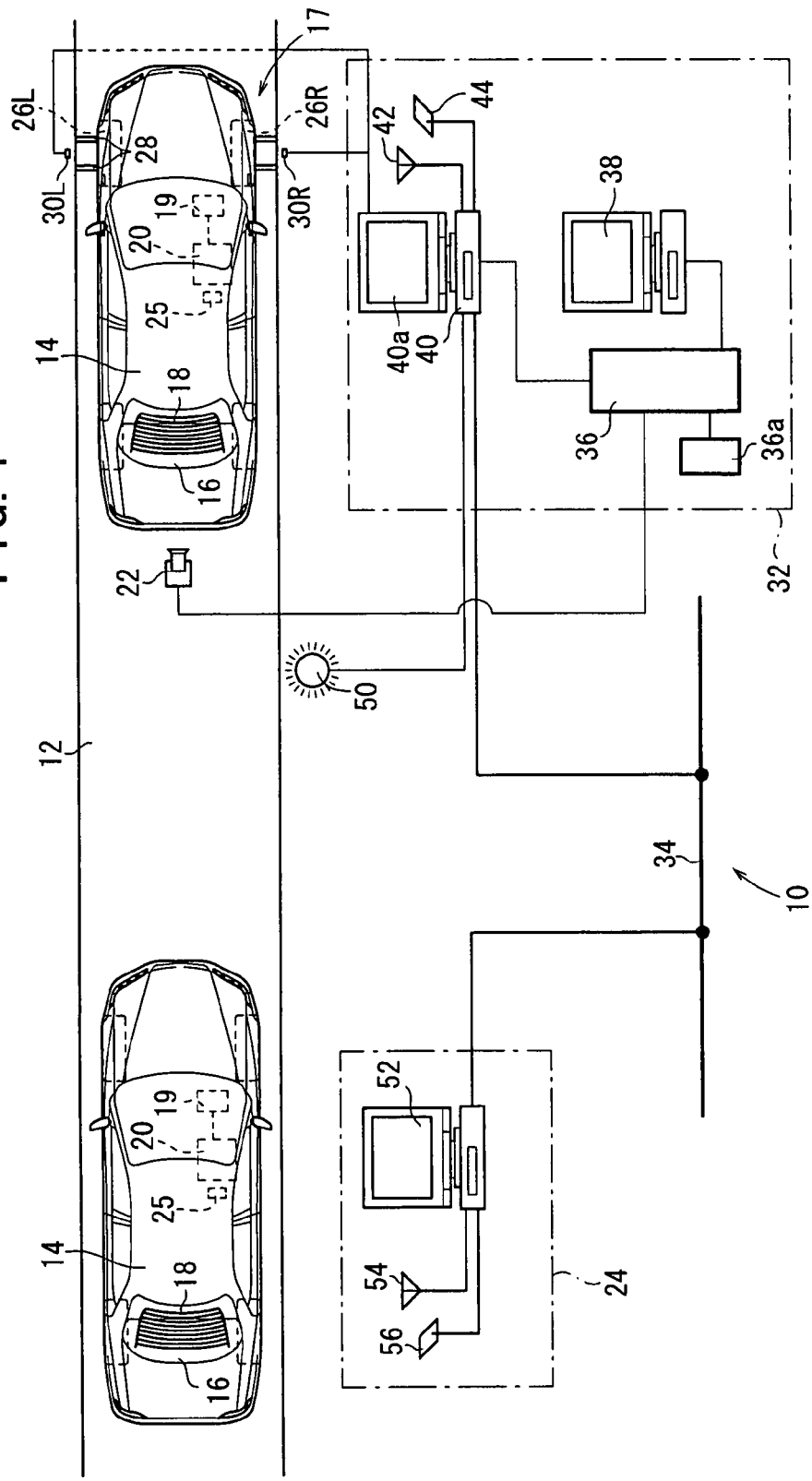
FIG. 1 is a schematic plan view of a wire disconnection inspecting device according to the present invention.

A wire disconnection inspecting device according to an embodiment of the present invention will be described below with reference to. FIGS. 1 through 13 of the accompanying drawings. In a wire disconnection inspecting device 10 and a vehicle 14, the mechanisms that are provided one on the left side and one on the right side will be distinguished from each other by "L" added to the reference numeral assigned to the left mechanism and "R" added to the reference numeral assigned to the right mechanism.

As shown in FIG. 1, the wire disconnection inspecting device 10 according to the embodiment is a device for inspecting a heater conductor 18 on a rear windshield 16 of an assembled vehicle 14 that is driven by the inspector to enter a track 12. The wire disconnection inspecting device 10 has a vehicle position recognizing unit 17 for detecting when the vehicle 14 reaches and stops at a prescribed inspection position, a terminal unit 20 connected to an ECU (Electronic Control Unit) 19 mounted on the vehicle 14, an infrared camera 22 for capturing an image of the rear windshield 16 of the vehicle 14 that has reached the inspection position obliquely from an upper rear position, and a preparation timing recognizing unit 24 for detecting when the vehicle 14 reaches the location of a process (e.g., a lamp inspecting process) preceding a wire disconnection inspecting process on the track 12 where the wire disconnection inspecting device 10 is installed. The infrared camera 22 can capture an image of an infrared radiation that is radiated depending on the temperature of a surface of an imaged object, and can detect the temperature of an object in an image capturing range thereof.

The heater conductor 18 comprises a parallel-connected circuit 21 of parallel lines (e.g., 9 lines in FIG. 9) extending horizontally so as to cover the rear windshield 16 substantially entirely. When a defroster switch, not shown, is turned on, the heater conductor 18 is energized to defog and defrost the rear windshield 16.

The vehicle 14 has a detachable inspection ID tag 25 bearing a model code (including vehicle type information, destination information, etc.) of the vehicle 14, a production number code, and information for identifying the terminal unit 20, which are written at an initial stage of a series of inspection steps.

The wire disconnection inspecting device 10 also has a main processor (inspection unit) 32 connected to the preparation timing recognizing unit 24, photoelectric switches 30L 30R, and the terminal unit 20, and acquiring thermal image data about a temperature distribution from the infrared camera 22. The main processor 32 and the preparation timing recognizing unit 24 are connected to each other by a LAN (Local Area Network) 34.

Figure 2:
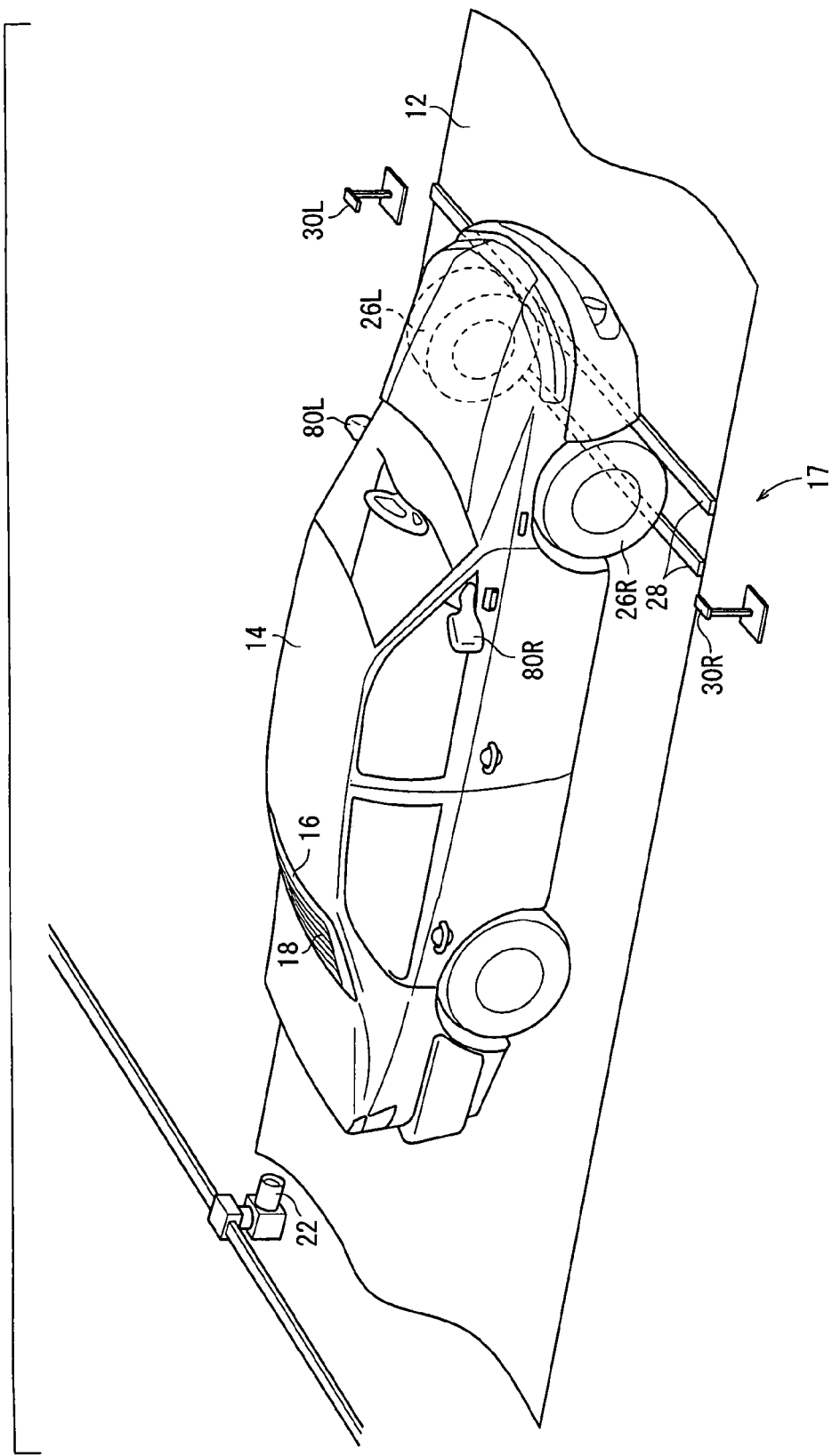
FIG. 2 is a perspective view showing a vehicle position recognizing unit, a vehicle, and an infrared camera disposed on a track.

As shown in FIG. 2, the wire disconnection inspecting device 10 has two wheel stops 28 extending across the track 12 and spaced from each other by a distance which is substantially the same as the ground contact width of front wheels 26L, 26R of the vehicle, and two photoelectric switches 30L, 30R for detecting the front wheels 26L, 26R that ride on the wheel stops 28. A sensor for detecting the state where the front wheels 26L, 26R ride on the wheel stops 28 may be a load cell or the like, for example.

Figure 3:
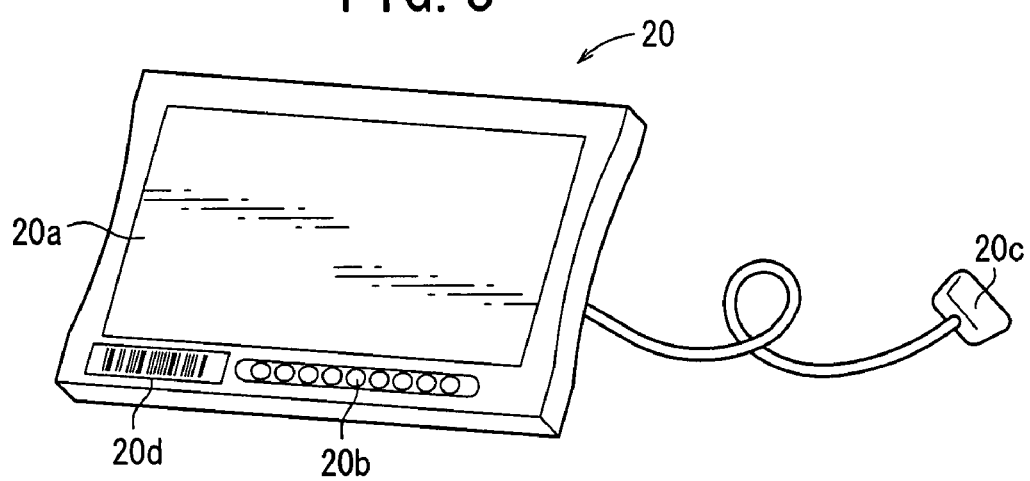
FIG. 3 is a perspective view of a terminal unit.

As shown in FIG. 3, the terminal unit 20 is of a flat portable type, and has a monitor 20a, a control pad 20b, a connector 20c connected to the ECU 19, a barcode 20d as an identification code, and a built-in antenna (not shown) for performing wireless communications with the main processor 32. The terminal unit 20 has been loaded with data representing an inspection sequence depending on the vehicle 14, from a predetermined server. The loading process is performed each time the wire disconnection inspecting device 10 starts to operate, thus making the wire disconnection inspecting device 10 flexible enough to handle a production plan on the day. The information of the terminal unit 20 which is recorded in the barcode 20d is read with a given reader by the inspector and written into the ID tag 25 referred to above.

Figure 4:
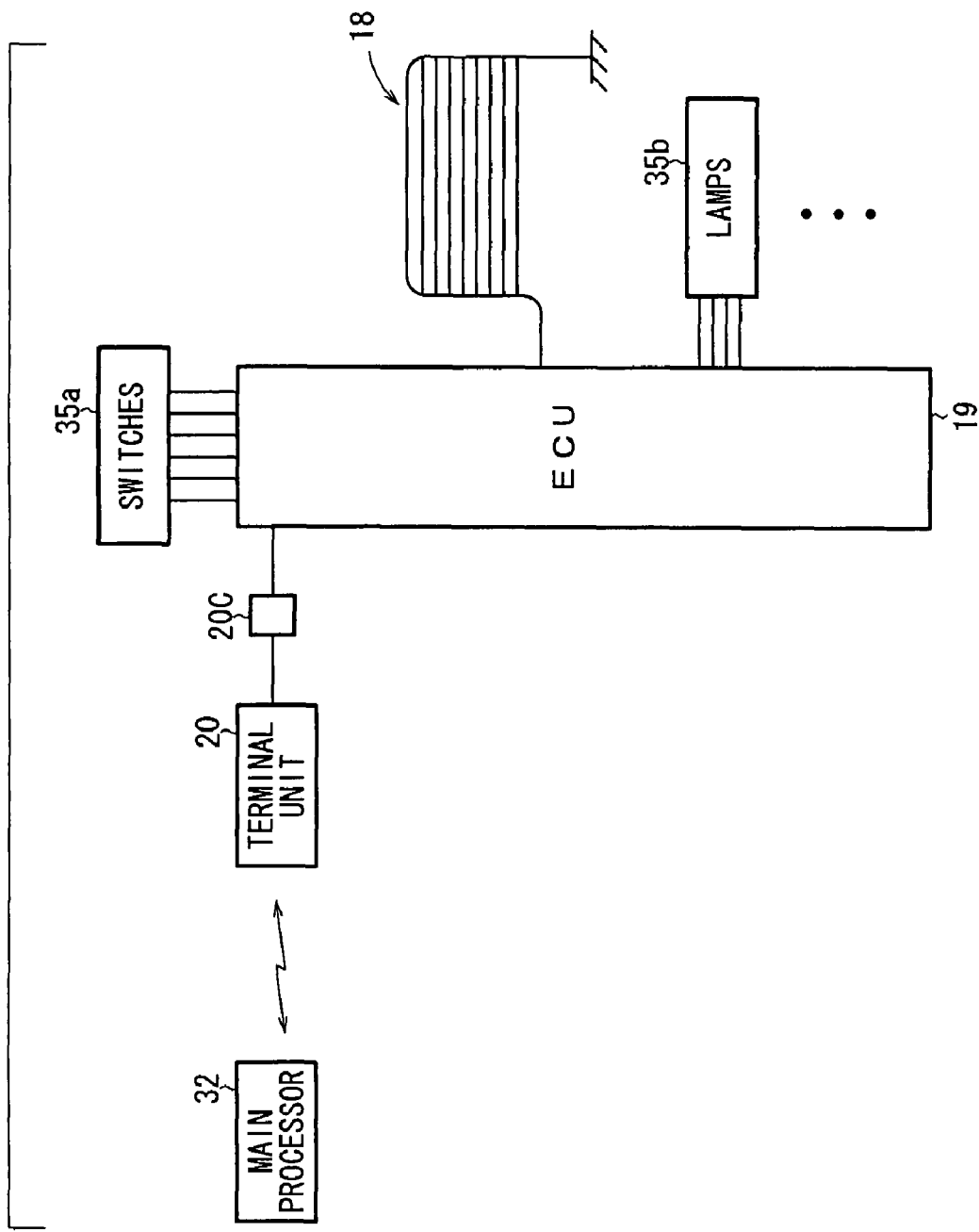
FIG. 4 is a schematic connection wiring diagram of the terminal unit, an ECU, and peripheral circuits thereof.

As shown in FIG. 4, when the terminal unit 20 is connected to the ECU 19, and the main processor 32 sends an operation signal to the terminal unit 20, the ECU 19 performs various operations to carry out an emulation process. According to the emulation process, an operation signal is sent to the ECU 19 to energize and heat the heater conductor 18, for example.

When the main processor 32 stops sending the operation signal to the terminal unit 20, or when the terminal unit 20 is disconnected from the ECU 19, the emulation process is finished and the ECU 19 returns to a normal mode wherein it controls the heater conductor 18, lamps, etc. based on signals supplied from operation switches 35a. The operation switches 35a include a defroster switch, lamp switches, turn indicator switches, a hazard flasher switch, etc. The connection wiring pattern between the ECU 19 and lamps 35b is not limited to the pattern shown in FIG. 4, but may be of another connection wiring type or may be in the form of a circuit including relays.

Figure 5:
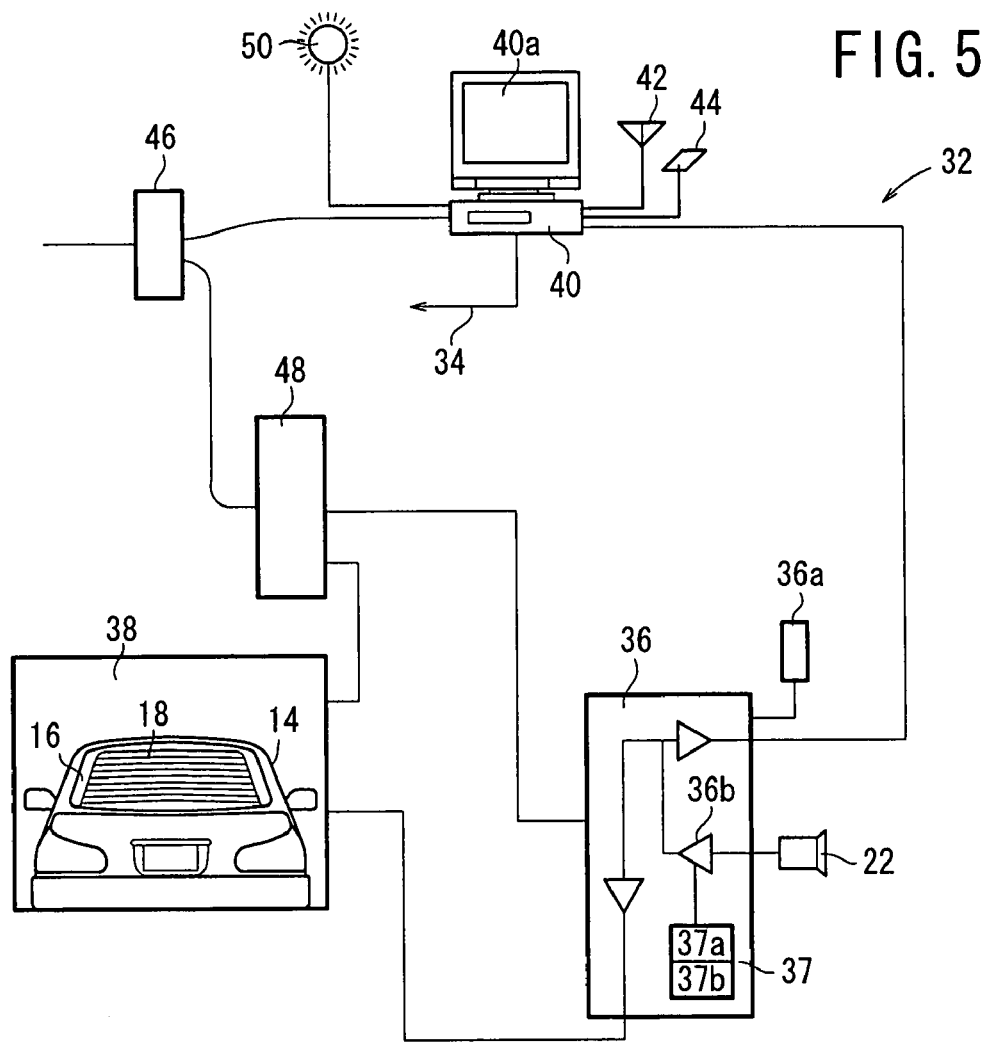
FIG. 5 is a block diagram of a main processor.

As shown in FIG. 5, the main processor 32 comprises a plurality of devices including a camera controller 36 for controlling the infrared camera 22, a confirmation monitor 38 for displaying acquired thermal image data for confirmation, a main computer 40 for performing a main control process such as for image processing, etc., a first antenna 42 connected to the main computer 40 for communications with the terminal unit 20, and a first RFID (Radio Frequency Identification) receiver 44 for receiving data from the ID tag 25.

The camera controller 36 has a console 36a for performing a given adjusting operation and a thermographic unit 36b for converting an original image obtained from the infrared camera 22 into an image represented in gradation colors as light's three primaries, e.g., red, green, and blue, dependent on the temperature of each pixel. Specifically, the thermographic unit 36b converts the original image such that high-temperature areas are indicated by warm colors and low-temperature areas are indicated by cold colors for the observer to be able to easily recognize the temperature distribution of the original image. A maximum value 37a and a minimum value 37b for temperature measurement and display are converted in scale by scale data 37 stored in a recording unit. The scale data 37 can be changed by a signal received from the main computer 40 or an operation of the console 36a. The maximum and minimum values of the scale data 37 are set to default values of 100° C. and 0° C., respectively (see FIG. 9).

The first RFID receiver 44 is able to recognize the model code of the vehicle 14, the production number code, and the identification number of the terminal unit 20 based on wireless information obtained from the ID tag 25. Signals of thermal image data supplied to the confirmation monitor 38 are NTSC (National Television Standards Committee) signals, for example, and are supplied as digital data to the main computer 40.

The main computer 40 is supplied with stable AC power from an uninterruptible power supply 46, and the camera controller 36 and the confirmation monitor 38 are supplied with stable DC power through a DC converter 48. A pilot lamp 50 for indicating that the vehicle 14 is being inspected is connected to the main computer 40, and is placed near the track 12.

Referring back to FIG. 1, the preparation timing recognizing unit 24 has a preparation computer 52, and a second antenna 54 and a second RFID receiver 56 which are connected to the preparation computer 52. The second antenna 54 has the same function as the first antenna 42, and the second RFID receiver 56 has the same function as the first RFID receiver 44.

When the preparation computer 52 detects the arrival of the vehicle 14 at a position near the preparation timing recognizing unit 24 based on the wireless information which is obtained from the ID tag 25 by the second RFID receiver 56, the preparation computer 52 transmits information representative of the arrival to the main computer 40 through the LAN 34. When the preparation computer 52 thereafter receives a confirmation signal returned from the main computer 40, the preparation computer 52 communicates with the terminal unit 20 through the second antenna 54 and controls the terminal unit 20 and the ECU 19 to start energizing the heater conductor 18.

Figure 6:
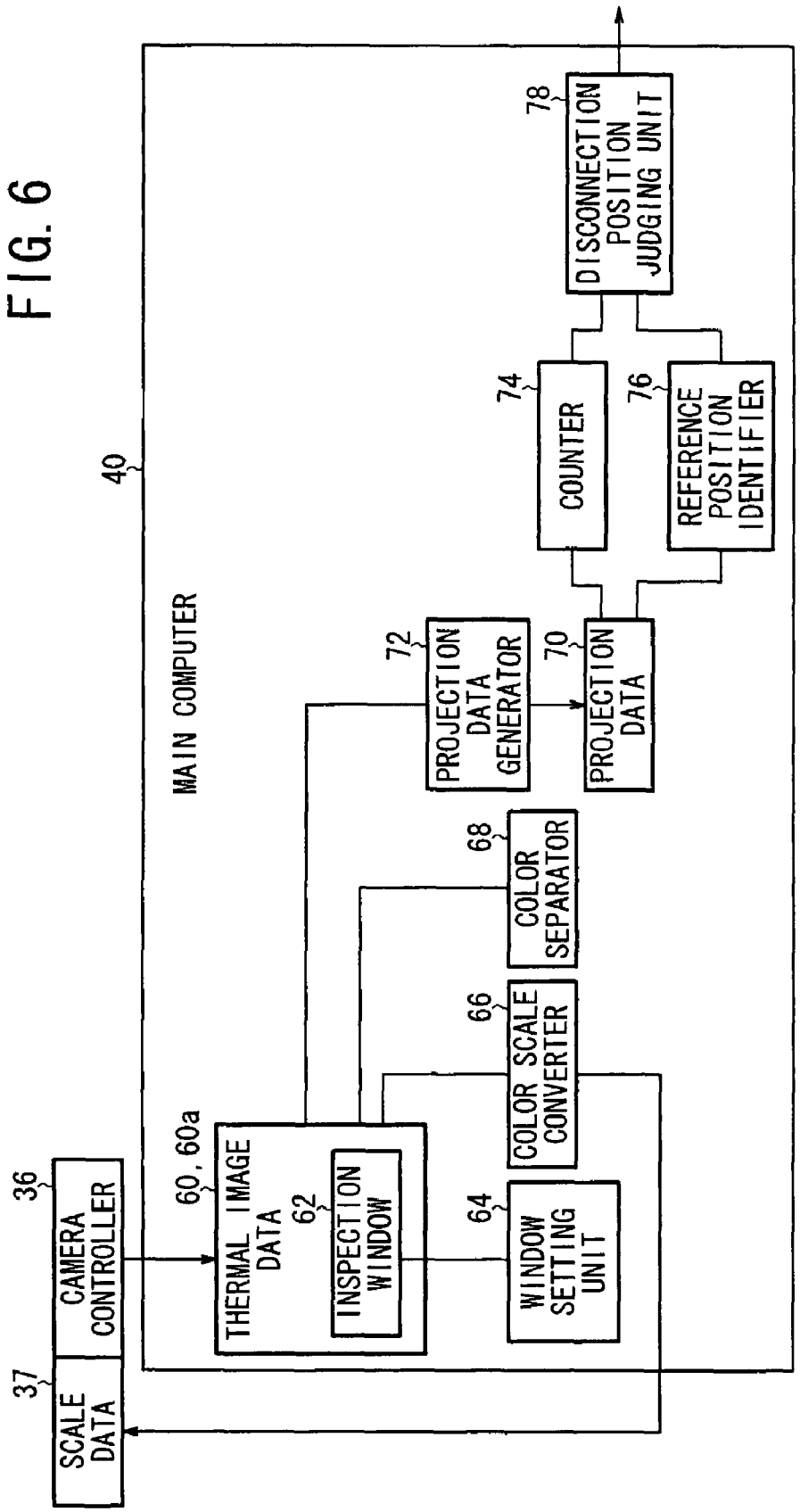
FIG. 6 is a functional block diagram of the main computer.

As shown in FIG. 6, the main computer 40 has a window setting unit 64 for establishing an inspection window 62 that defines a processing range on thermal image data (see FIG. 9) 60 obtained from the camera controller 36, a color scale converter 66 for converting the thermal image data 60 in scale based on the scale data 37, a color separator 68 for separating color data of pixels in the established inspection window into red, green, and blue components, and a projection data generator 72 for projecting values represented by the pixels in the inspection window 62 in an X direction (i.e., a horizontal direction across the vehicle 14) on the image and totaling and adding the values thereby to generate projection data 70. The main computer 40 also has a counter 74 for counting the number P of energized lines of the parallel lines of the parallel-connected circuit 21 from an area above a threshold value Th (see FIG. 11) in the projection data 70, a reference position identifier 76 for identifying a region indicative of a vehicle end 14a (see FIG. 11) on the projection data 70, and a disconnection position judging unit 78.

If the number P of lines of the parallel-connected circuit 21 which is counted by the counter 74 is smaller than a prescribed number N for each vehicle 14, the disconnection position judging unit 78 determines distances $L_1, L_2, L_3, \ldots, L_P$ (P represents the count) from a reference region representative of the vehicle end 14a to respective regions greater than the threshold value Th, and compares the distances $L_1$-$L_P$ with corresponding prescribed distances $A_1, A_2, A_3, \ldots, A_N$ thereby to determine a wire disconnection portion. The number N is determined depending on the model code obtained from the ID tag 25. In the vehicle 14 to be inspected according to the embodiment, the number N is N=9 and the nine parallel lines are denoted respectively by $18a, 18b, 18c, \ldots, 18i$, respectively (see FIG. 9).

The functional blocks shown in FIG. 6 are basically software functions implemented when a program stored in a storage unit is read and executed by a CPU.

Figure 7:
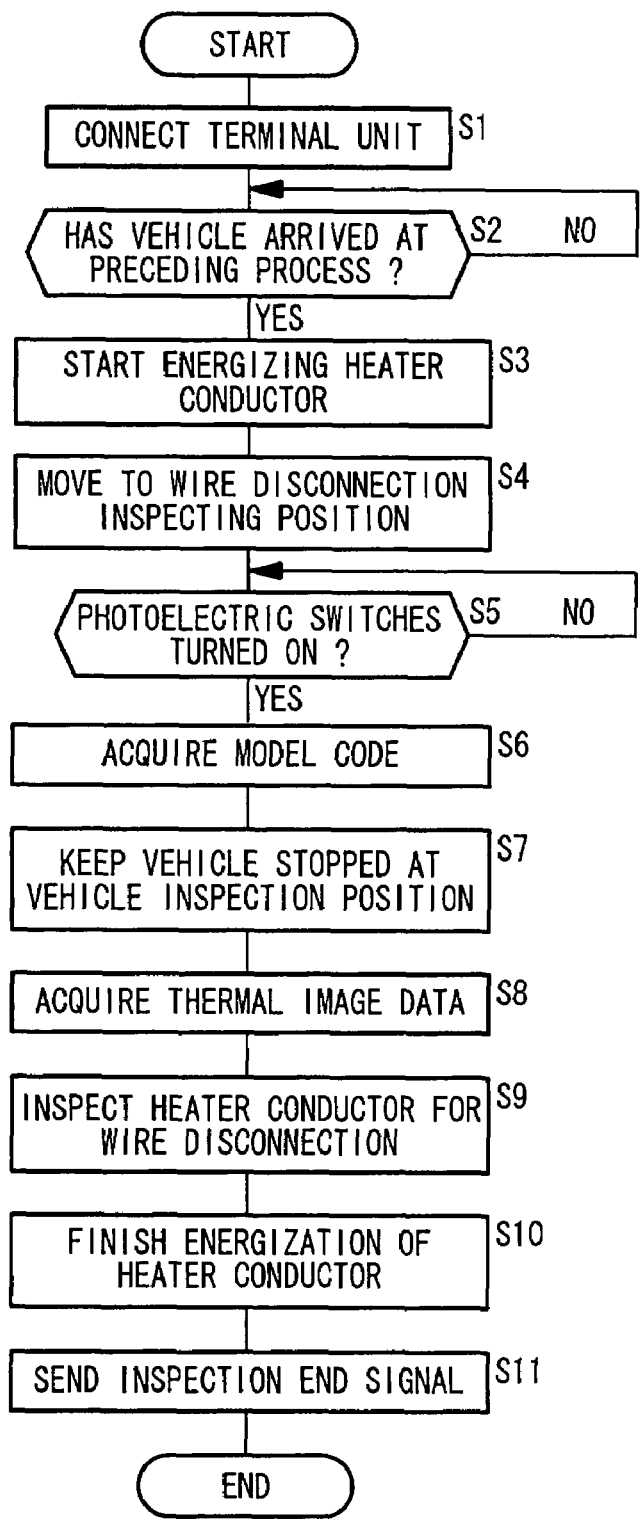
FIG. 7 is a flowchart of a wire disconnection inspecting procedure carried out by the wire disconnection inspecting device.

A procedure for inspecting the heater conductor 18 for a wire disconnection using the wire disconnection inspecting device 10 will be described below with reference to FIG. 7. In the description which follows, it is assumed that the processing sequence will be carried out in the order of indicated step numbers unless otherwise stated.

In step S1, a cover in the passenger compartment of the vehicle 14 is removed, and the terminal unit 20 is connected to a connector in the passenger compartment.

In step S2, the inspector drives the vehicle 14 to move it to a process preceding the wire disconnection inspecting process where the wire disconnection inspecting device 10 is installed. The preparation timing recognizing unit 24 waits until the arrival of the vehicle 14 at the preceding process is recognized through the ID tag 25 and the second RFID receiver 56. The recognition of the arrival of the vehicle 14 at the process is not limited to the recognizing process based on the wireless communications using the ID tag 25 and the second RFID receiver 56, but may be performed using a means similar to the vehicle position recognizing unit 17 (see FIG. 2).

If the arrival of the vehicle 14 at the process preceding the wire disconnection inspecting process is recognized, then, in step S3, the preparation timing recognizing unit 24 sends a notification signal to and receives a confirmation signal from the main computer 40, and controls the terminal unit 20 through the second antenna 54 to start energizing the heater conductor 18. The vehicle 14 is inspected according to the inspection process other than the wire disconnection inspecting process.

After the preceding process is finished, the inspector moves the vehicle 14 to the inspection position near the wire disconnection inspecting device 10. Specifically, as shown in FIG. 2, the inspector drives the vehicle 14 until the front wheels 26L, 26R ride between the two wheel stops 28, and then stops the vehicle 14, which is now positioned. At this time, the photoelectric switches 30L, 30R detect the arrival of the front wheels 26L, 26R at the inspection position, and transmit on-signals to the main processor 32.

A predetermined time has now elapsed depending on the inspection time in the preceding process from the time when the heater conductor 18 has started to be energized. Therefore, the heater conductor 18 has been heated appropriately. If the inspection time in the preceding process is very short, then the heater conductor 18 may start to be energized in a process prior to the preceding process.

In step S5, the main processor 32 waits until it is supplied with on-signals from the photoelectric switches 30L, 30R. If the main processor 32 detects the on-signals, then control goes to step S6.

In step S6, the main processor 32 acquires the production number code of the vehicle 14 and the terminal unit 20 that are recorded on the ID tag 25, through the first RFID receiver 44, and turns off the pilot lamp 50 that has been turned on or controls the pilot lamp 50 to display a different color.

In step S7, the main processor 32 communicates with the terminal unit 20 to confirm whether the vehicle speed is 0, the foot brake is turned off, and the side brake is turned on. The terminal unit 20 acquires the corresponding information from the ECU 19 and transmits the acquired information to the main processor 32. Since the vehicle speed is 0 and the side brake is turned on, it is confirmed that the vehicle 14 is completely stopped, so that a reliable wire disconnection inspection can be conducted.

While making the above confirmations, the main processor 32 simultaneously loads an inspection program corresponding to the acquired model code from the storage unit such as a hard disk or the like. The inspection program includes information about an inspection sequence, the position of the heater conductor 18, and the number N of lines of the parallel-connected circuit 21 for each of the types of vehicles 14.

In step S8, the main computer 40 acquires the thermal image data 60 (see FIG. 9) from the infrared camera 22 through the camera controller 36. As described above, the thermal image data 60 represents a color image depending on the color distribution which is produced by the thermographic unit 36b. The thermal image data 60 contains the scale data 37 and the maximum and minimum values 37a, 37b on display.

In step S9, the main computer 40 inspects the heater conductor 18 for a wire disconnection based on the acquired thermal image data 60. Processing details of step S9 will be described later on.

In step S10, the main computer 40 communicates with the terminal unit 20 through the second antenna 54 and controls the terminal unit 20 to end the energization of the heater conductor 18.

In step S11, the main processor 32 sends a signal representing the end of the inspection and information representing the results of the inspection to the terminal unit 20, which displays the results of the inspection on the monitor 20a, and energizes the pilot lamp 50 or controls the pilot lamp 50 to display the original color.

The inspector sees the monitor 20a and recognizes the results of the inspection. If the results of the inspection are normal, then the inspector drives the vehicle 14 down the track 12 to a next inspection process. If the results of the inspection are abnormal, then the inspector drives the vehicle 14 into a retreat area for a necessary check.

Data of the results of the inspection obtained by the wire disconnection inspecting device 10 are stored in the respective storage units of the terminal unit 20 and the main computer 40 in association with the production number code of the vehicle 14. After the wire disconnection inspecting process performed by the wire disconnection inspecting device 10 and all other inspections are finished, the terminal unit 20 and the ID tag 25 are removed from the vehicle 14.

Figure 8:
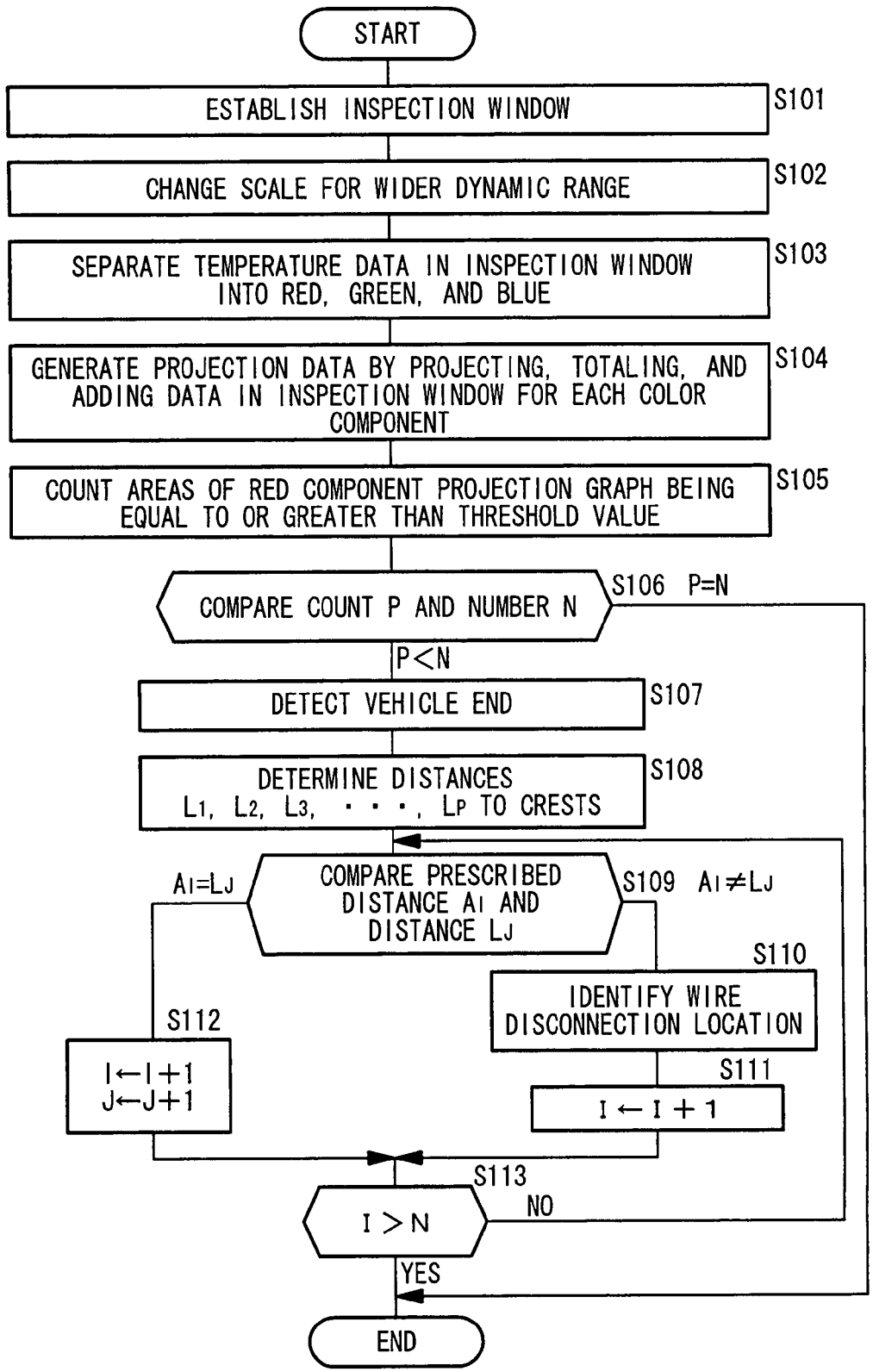
FIG. 8 is a flowchart of a detailed wire disconnection inspecting procedure carried out based on thermal image data.

The processing details of step S9 shown in FIG. 7 will be described with reference to FIG. 8. The wire disconnection inspecting process shown in FIG. 8 is primarily performed by the main computer 40 and executed by the functional blocks shown in FIG. 6 which cooperate with each other.

Figure 9:
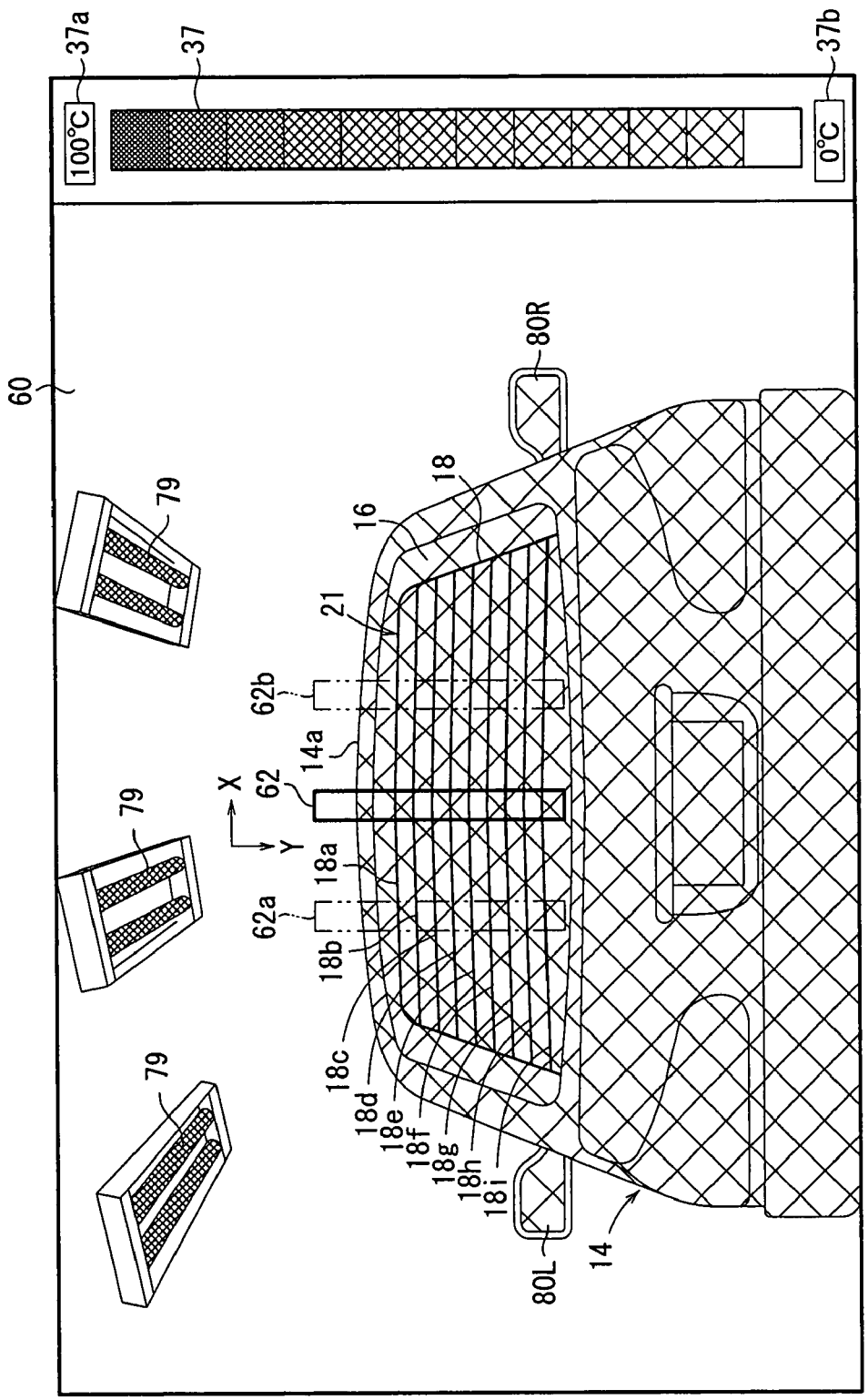
FIG. 9 is a schematic view showing thermal image data captured by the infrared camera.

In step S101, as shown in FIG. 9, an inspection window 62 including respective portions of the N parallel lines 18a through 18i of the parallel-connected circuit 21 and the vehicle end 14a is established on the thermal image data 60. The inspection window 62 thus established limits a processing range for a reduced inspection time and eliminates unnecessary portions of the thermal image data 60 for an accurate inspection.

In step S102, temperature data in the inspection window 62 are searched to determine a maximum temperature Tmax and a minimum temperature Tmin, and a scale change is made using these two values to provide a wider dynamic range. Specifically, Tmax (which will hereinafter be assumed to be 27° C.) is written as the maximum scale value 37a into the scale data 37 and Tmin (which will hereinafter be assumed to be 22° C.) is written as the minimum scale value 37b into the scale data 37.

The thermal image data 60 is now converted in scale depending on the scale data 37, producing thermal image data 60a (see FIG. 10) with the inspection window 62 representing a wide hue range (which may be a color range including brightness and chroma saturation). In the inspection window 62, relatively-high-temperature areas are stressed by warm colors and relatively-low-temperature areas by cold colors for sharp contrast. In other words, the scale range of the thermal image data 60 which are initially defined as the range from 0 to 100° C. by the default values is reduced to the range from, for example, 22 to 27° C. for thereby increasing the resolution 20 times (20=(100−0)/(27−22)).

Since the scale conversion process is carried out based on the maximum and minimum temperatures Tmax, Tmin in the inspection window 62 at the time, it is not adversely affected by the heated state (heating time, battery state, etc.) of the heater conductor 18 and environmental changes (the season and the temperature difference between morning and evening time zones), making it possible to perform a stable inspection.

The change of the scale range may possibly bring other areas than the inspection window 62 (e.g., fluorescent lamps 79, etc.) out of the scale range, and saturate the displayed colors. However, no problem arises because these areas have no bearing on the wire disconnection inspection of the heater conductor 18.

Figure 10:
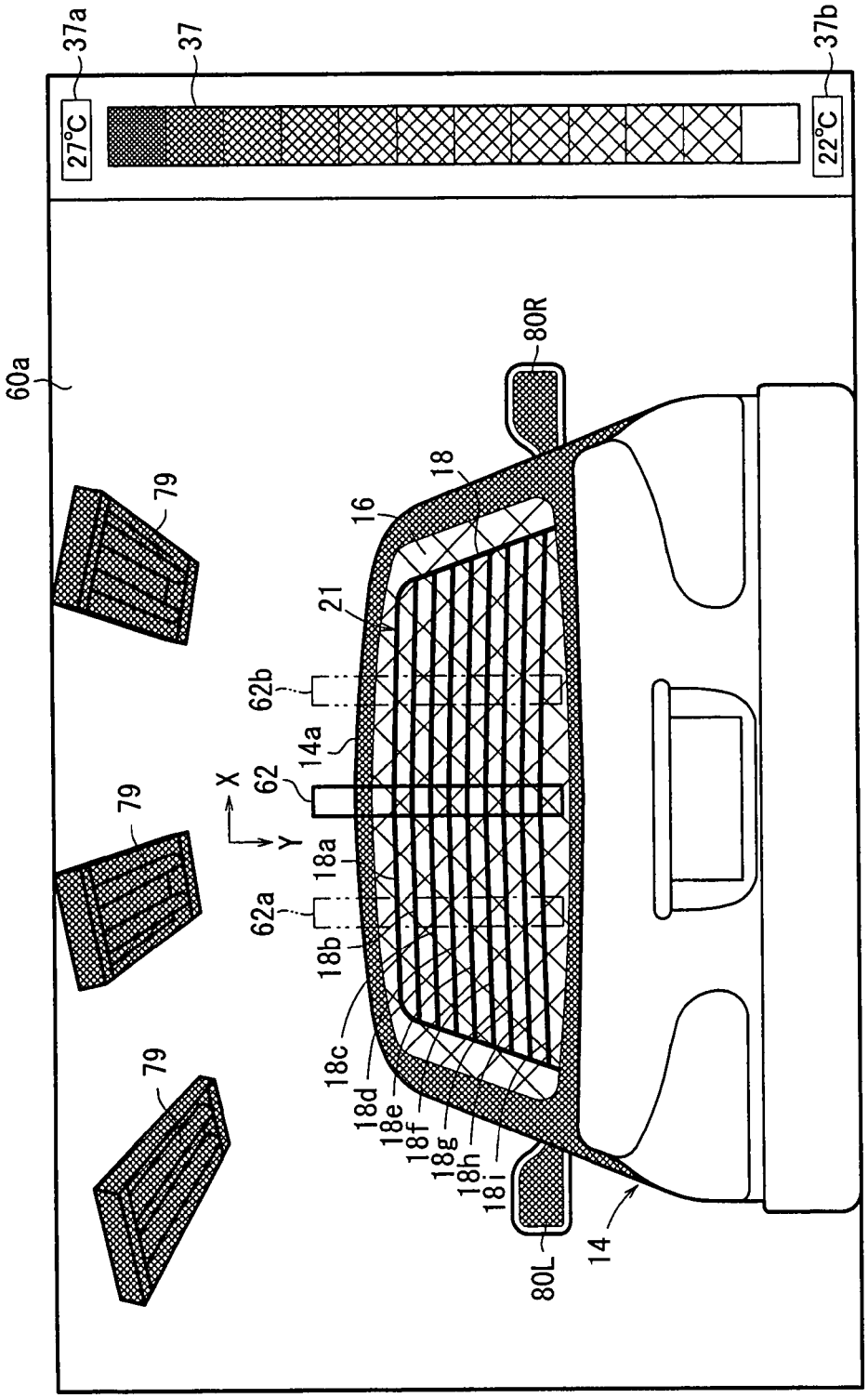
FIG. 10 is a schematic view showing thermal image data converted in scale.

Since no color presentations are possible in FIGS. 9 and 10, the warm-color areas are shown hatched with thick or closely spaced lines, the cold-color areas hatched with thin lines or unhatched, and intermediate-hue areas hatched with normally thick or coarsely spaced lines.

The scale range may be changed by a measurement range Tmax+Tα through Tmin−Tα which represents an increase from the range between the maximum and minimum temperatures Tmax, Tmin by a prescribed marginal interval Tα at each end, for making the measurements flexible and versatile. If the value of the marginal interval Tα is too large, then the dynamic range cannot be increased greatly. Actually, the marginal interval Tα may be set in a range of $0° C. \leq T\alpha \leq 10° C.$ preferably in a range of $0° C. \leq T\alpha \leq 5° C.$ The marginal interval Tα may be set depending on the difference between the maximum and minimum temperatures Tmax, Tmin (e.g., 10% of the value of the difference).

If there is no heat-generating body other than the vehicle 14 or the image capturing range of the thermal image data 60 is limited to the rear windshield 16, then the scale may be changed by a maximum temperature and a minimum temperature that are detected from the entire range of the thermal image data 60.

In step S103, the temperature data in the inspection window 62, i.e., the color data displayed on a monitor 40a (see FIG. 1) of the main computer 40, are separated into three primary components of red, green, and blue. Generally, data representing colors to be displayed on the monitor 40a comprise three primary components of red, green, and blue. The data are established, for each pixel, as color data represented by a total of three bytes, a high-order byte of red, a middle byte of green, and a low-order byte of blue, for example. The data thus configured make it possible to display about 160,000 ($256^3$) colors.

If the color data of a pixel are represented by a hexadecimal number 0x123456 (0x is an identifier indicative of a hexadecimal number), then a high-order byte representing red component data is extracted as 0x120000←0x123456&0xFF0000 (& is a logical AND operator), shifted two bytes toward the low-order position, and separated as 0x000012. A middle byte representing green component data is extracted as 0x030400←0x123456&0x00FF00, shifted one byte toward the low-order position, and separated as 0x000034. A low-order byte representing blue component data is extracted and separated as 0x000056←0x123456&0x0000FF.

In the thermal image data 60a, high-temperature areas are indicated by warm colors and low-temperature areas by cold colors. Therefore, data representing red which is a warm color is produced by extracting a high-temperature area, and data representing blue which is a cold color is produced by extracting a low-temperature area.

Figure 11:
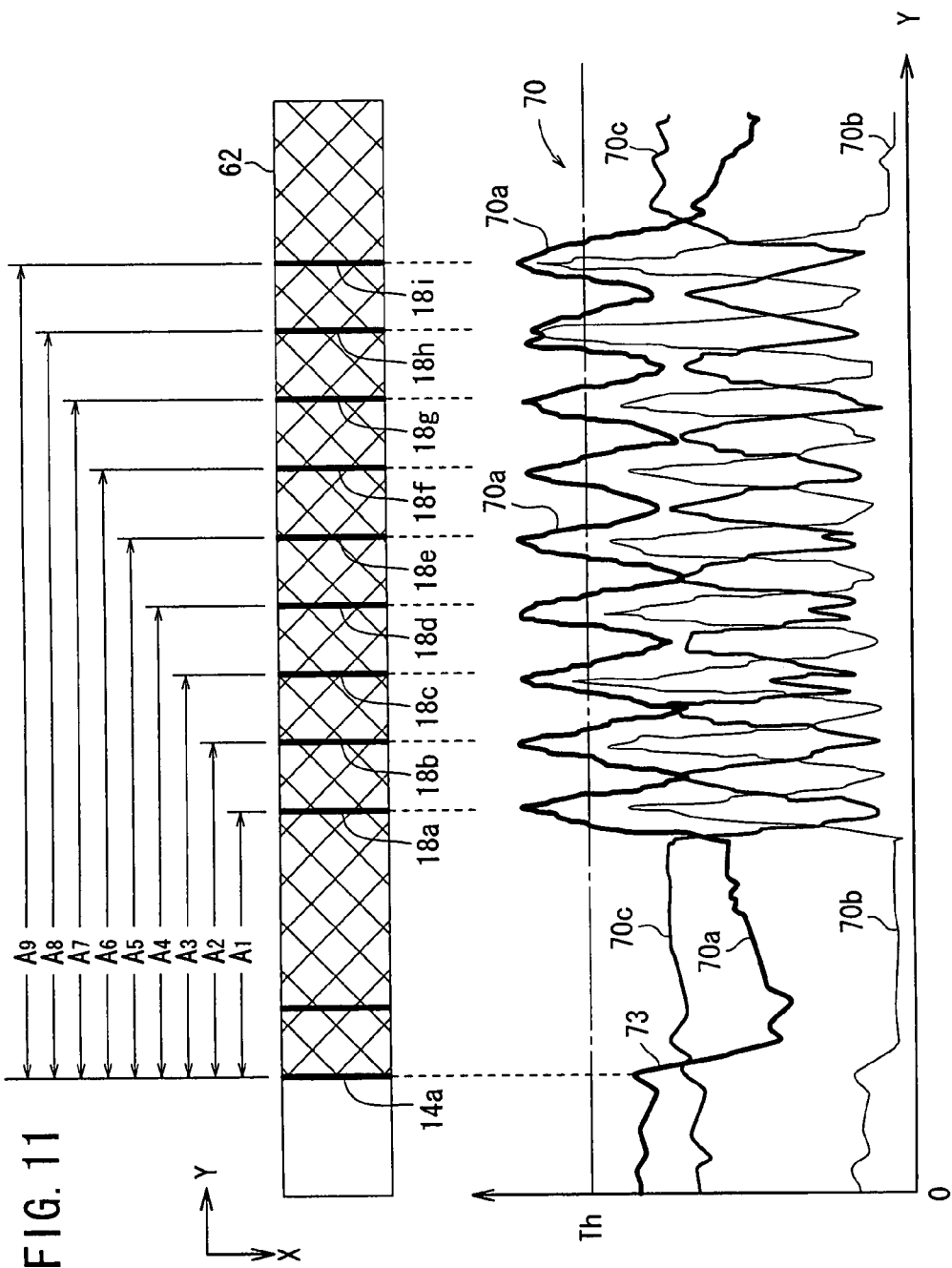
FIG. 11 is a diagram showing the relationship between an inspection window and projection data.

In step S104, the values indicated by the pixels in the inspection window 62 are projected, totaled, and added in the X direction for each of the separated red, green, and blue components, thereby generating projection data 70 shown in FIG. 11. The projection data 70 may be any data insofar as it projects a distribution of each of the color components in the inspection window 62, and may be represented by average values, rather than totaled and added values.

The projection data 70 has a red component projection graph 70a, a green component projection graph 70b, and a blue component projection graph 70c which represent respective totals of red, green, and blue components in the X direction. The red component projection graph 70a exhibits a tendency to have larger values in high-temperature areas in the form of peaks. Conversely, the blue component projection graph 70c exhibits a tendency to have values in low-temperature areas in the form of peaks. The red component projection graph 70a and the blue component projection graph 70c are substantially in opposite phase with each other. The red component projection graph 70a has nine peaks in the areas where the heater conductor 18 of the parallel-connected circuit 21 is present.

The green component projection graph 70b is essentially in phase with and has values smaller than the red component projection graph 70a. In the area corresponding to the vehicle end 14a, the red component projection graph 70a has a sharp step 73.

In step S105, the number of peaks above the threshold value Th of the red component projection graph 70a of the projection data 70 is counted. In view of the influence of noise or the like, the number of peaks may be counted while the red component projection graph 70a is being smoothed. The threshold value Th is preset as a suitable value greater than the step 73 and smaller than the crests of the peaks. For example, the threshold value Th may be set to an intermediate value between the average height of the expected crests of the red component projection graph 70a and the greatest height of the expected step 73. The count P thus obtained represents the number of energized and heated ones, free of a wire disconnection, of the N parallel lines 18a through 18i.

Since the red component projection graph 70a is a graph produced by extracting and projecting red components only, it is clearly distinguished from areas where there are many blue components though at about the same brightness level, and contains distinct peaks and valleys. Therefore, the red component projection graph 70a allows the count P of energized lines to be accurately determined by establishing the appropriate threshold value Tn.

The count P may be generated by counting the number of peaks of the green component projection graph 70b or counting the number of valleys of the blue component projection graph 70c.

In step S106, the count P and the predetermined number N are compared with each other. If P=N, then it is judged that there is no wire disconnection, and the wire disconnection inspecting process shown in FIG. 8 is put to an end. If P<N, then it is judged there is a wire disconnection or a conduction failure location, and control goes to step S107. If P>N, then a predetermined attention calling process is performed to prompt the inspector to reestablish the threshold value Th though such a branching process is omitted from illustration.

In step S107, the red component projection graph 70a is searched or differentiated in a Y direction (a downward direction across the vehicle 14) to identify a sharp step as the step 73, thereby detecting an area corresponding to the vehicle end 14a.

Figure 12:
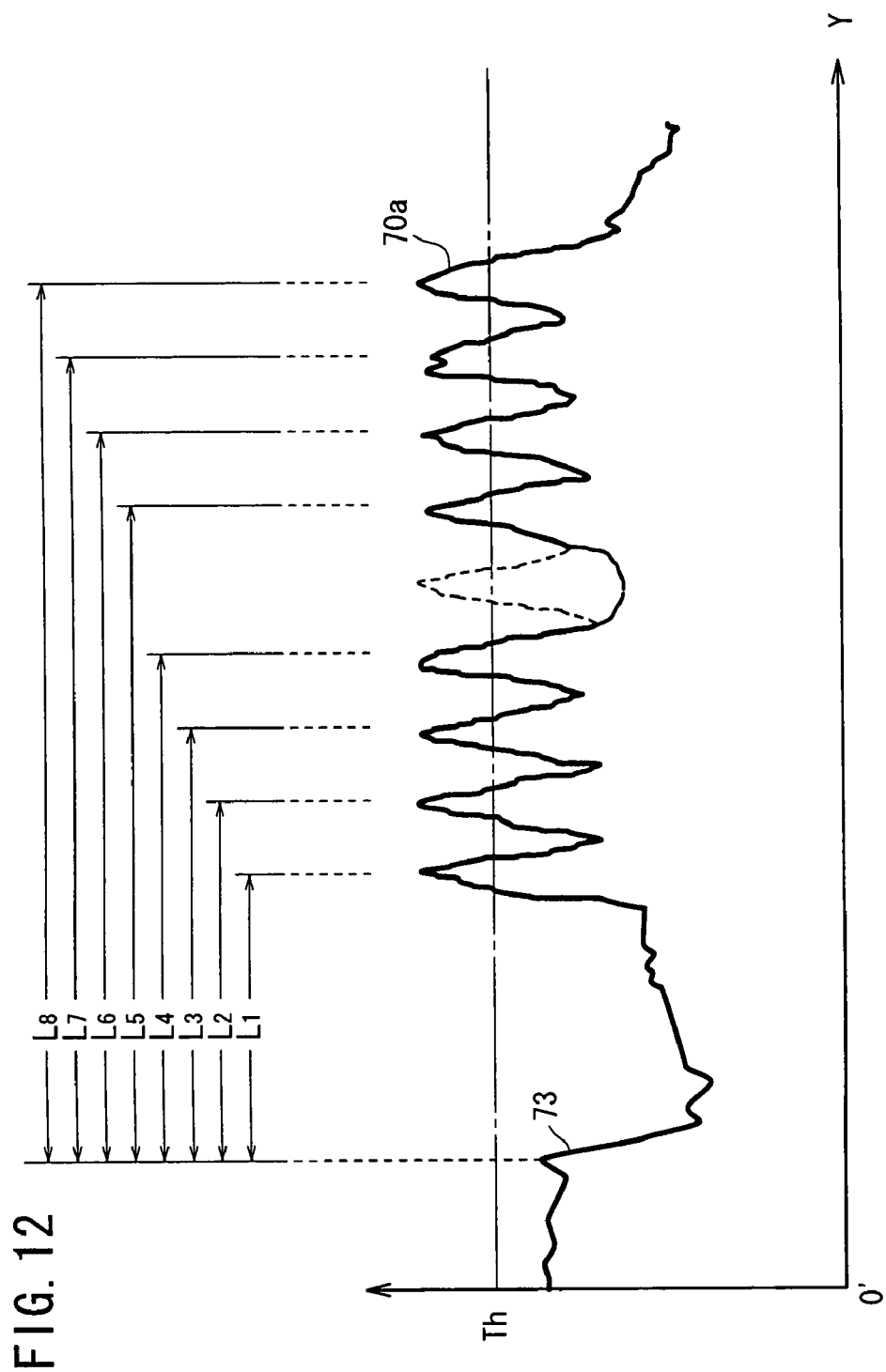
FIG. 12 is a diagram showing projected data produced when a fifth heater conductor is disconnected.

In step S108, as shown in FIG. 12, the red component projection graph 70a is further searched or differentiated in the Y direction to determine distances $L_1, L_2, L_3, \ldots, L_P$ (P<N) up to the crests of the peaks above the threshold Th. In the example shown in FIG. 12, the fifth heater conductor 18 from the vehicle end 14a suffers a wire disconnection, and there is no peak at the fifth heater conductor 18. Therefore, the distance corresponding to the sixth parallel line 18f is determined as $L_5$, and the distances corresponding to the seventh, eighth, and ninth parallel lines 18g, 18h, 18i are determined as $L_6, L_7, L_8$.

In step S109, using counters I, J that are initially set to 1 as parameters, a prescribed distance $A_I$ (see FIG. 11) and a distance $L_J$ are compared with each other. If they agree with each other, then control goes to step S112, and if they do not agree with each other, then control goes to step S110. If the prescribed distance $A_I$ and the distance $L_J$ are not in full agreement, when they agree with each other in a range of ±5%, for example, it can be regarded as they agree with each other. The prescribed distance $A_I$ is determined from the model code obtained from the ID tag 25.

In step S110, the numerical value of the counter I is identified as the number of the location where the wire disconnection has occurred. The counter I is recorded in the storage unit in association with the model code and the production number code.

In step S111, only the counter I is incremented as I←I+1. Then, control goes to step S113.

In step S112, both the counters I, J are incremented as I←I+1, J←J+1.

In step S113, the counter I and the number N are compared with each other. If I≦N, then control goes back to step S109 to continue the process of identifying the location at which the wire disconnection has occurred. If I>N, then the process shown in FIG. 8 is put to an end.

According to the process shown in FIG. 8, the number P of energized ones of the parallel lines 18a through 18i can automatically be counted based on the projection data 70, and hence all locations where a wire disconnection has occurred can be identified. As shown in FIG. 13, if the heater conductor 18a at an end is disconnected, then since the distances between the crests are substantially equal to each other, it can easily be recognized that the heater conductors 18b through 18h are energized, but it is difficult to identify whether the wire disconnection has occurred in the heater conductor 18a at an end or the heater conductor 18i at the other end. According to the present embodiment, however, because a location where a wire disconnection has occurred is determined based on the prescribed distances $A_1, A_2, \ldots, A_N$ from the vehicle end 14a, if the heater conductor 18a at an end is disconnected, then the location where the wire disconnection has occurred is accurately determined due to disagreement between the distance $L_1$ and the prescribed distance $A_1$, so that the wire disconnection can be distinguished from the wire disconnection in the heater conductor 18i at the other end.

According to the present embodiment, as described above, when the preparation timing recognizing unit 24 detects a preparation timing, the heater conductor 18 is automatically energized through the terminal unit 20. When the vehicle 14 reaches the inspection position and the infrared camera 22 captures an image of the rear windshield 16, the heater conductor 18 has been heated to an appropriate temperature. Therefore, the image can be captured and the heater conductor 18 can be inspected for a wire disconnection without an undue wait time. As the process is automated, no human-induced error is involved and a reliable wire disconnection inspection is possible.

The wire disconnection inspecting device 10 is suitably applicable to an inspection line for inspecting assembled vehicles. The wire disconnection inspecting device 10 may be installed in a second or subsequent inspecting process on the inspection line, so that the heater conductor 18 can be heated in advance in a previous process.

The timing at which the heater conductor 18 is energized in advance is determined by the inspection time in the preceding process, and the heater conductor 18 has been energized for a prescribed time before it is imaged by the infrared camera 22. If the wire disconnection inspecting device 10 is considerably spaced apart from the preceding process, then the preparation timing recognizing unit 24 may be installed in an appropriate position somewhere therebetween, and the heater conductor 18 may start to be energized when the vehicle 14 has passed a prescribed distance before the wire disconnection inspecting device 10. Therefore, the preparation timing for starting to energize the heater conductor 18 is established based on the prescribed time and/or the prescribed distance.

According to the present embodiment, furthermore, the maximum and minimum values 37a, 37b of the scale data 37 which represents a display color scale are established for color conversion based on the maximum and minimum temperatures in the inspection window 62 at the time. Therefore, the image of the heater conductor 18 is appropriately identified for an accurate inspection regardless of different heated states of the heater conductor 18 and environmental changes. The color-converted thermal image data 60a allows the image of the heater conductor to be easily identified when the inspector visually confirms the image.

If left and right side mirrors 80L, 80R (see FIG. 9) have heater conductors, then they can be inspected for a wire disconnection by the wire disconnection inspecting device 10 in the same manner as with the heater conductor 18 on the rear windshield 16. The single infrared camera 22 may be used to inspect both the side mirrors 80L, 80R for a wire disconnection. Two infrared cameras 22 for capturing images of the right and left mirror surfaces may be provided for inspecting the side mirrors 80L, 80R more accurately.

The inspection window 62 is not limited to a single inspection window. Two inspection windows 62a, 62b (see FIG. 9) may be provided in horizontally symmetrical positions, respectively, to inspect the heater conductor for a wire disconnection at their respective positions for increased inspection reliability.

The above heater conductor 18 has been described as comprising the parallel-connected circuit 21. However, the circuit of the heater conductor 18 is not limited to simple parallel-connected circuit, but may include a series-connected circuit partly therein, for example, insofar as it can be imaged as parallel lines in the inspection window 62.

The thermal image data 60 may be such data as producing a gray-scale image having a plurality of gradations where high-temperature areas are indicated by high brightness levels and low-temperature areas by low brightness levels. In this case, a graph corresponding to the red component projection graph 70a is produced by extracting and projecting only components equal to greater than a predetermined threshold value within the inspection window 62 established on the gray-scale image.

The invention claimed is:

1. A wire disconnection inspecting method comprising the steps of:
   connecting a terminal unit to an electronic control unit mounted on a vehicle;
   detecting a preparation timing which is a prescribed distance and/or a prescribed time before said vehicle reaches a prescribed inspection position, for an inspection unit to start energizing a heater conductor on a glass panel of said vehicle through said terminal unit; and
   when the arrival of said vehicle at the prescribed inspection position is detected, controlling said inspection unit to acquire a thermal image of said glass panel captured by an infrared camera and processing said thermal image to inspect said heater conductor for a wire disconnection.

2. A wire disconnection inspecting method according to claim 1, wherein said heater conductor comprises a circuit of a plurality of parallel lines extending in a predetermined direction on said glass panel, said wire disconnection inspecting method comprising the step of
   controlling said inspection unit to:
   establish an inspection window on said thermal image, said inspection window including a vehicle end and at least a portion of each of the parallel lines of said circuit;
   generate projection data by projecting and adding temperature data in said inspection window per unit column in said predetermined direction;
   count the number of parallel lines of said circuit which are energized from areas having said projection data equal to or higher than a threshold value; and
   if said number is smaller than a prescribed value, determine distances up to the areas having said projection data equal to or higher than said threshold value from an area representing said vehicle end, and compare the distances with respective prescribed distances to determine a location where a wire disconnection has occurred.

3. A wire disconnection inspecting method according to claim 1, comprising the steps of:
   setting an upper limit value of a color scale for converting said thermal image for display to a maximum temperature in an image processing range in said thermal image and setting a lower limit value of said color scale to a minimum temperature in said image processing range;
   converting colors of said thermal image based on said color scale;
   extracting component values of colors including red, green, and blue per pixel from the color-converted thermal image; and
   inspecting said heater conductor for a wire disconnection based on the extracted component values of the colors.

4. A wire disconnection inspecting method according to claim 3, wherein said heater conductor comprises a circuit of a plurality of parallel lines extending in a predetermined direction on said glass panel, said wire disconnection inspecting method comprising the steps of:
   establishing an inspection window on said thermal image, said inspection window including at least a portion of each of the parallel lines of said circuit;
   generating projection data by projecting and adding said component values of the colors in said inspection window per unit column in said predetermined direction; and
   inspecting said heater conductor for a wire disconnection based on said projection data.

5. A wire disconnection inspecting method according to claim 3, wherein said heater conductor comprises a circuit of a plurality of parallel lines extending in a predetermined direction on said glass panel, said wire disconnection inspecting method comprising the steps of establishing an inspection window including at least a portion of each of the parallel lines of said circuit, as an image processing range, and setting the upper limit value of said color scale to a maximum temperature in said inspection window.

6. A wire disconnection inspecting device for inspecting a heater conductor on a glass panel of a vehicle after the vehicle has been assembled, comprising:

a vehicle position recognizing unit for detecting arrival of said vehicle at a prescribed inspection position;

a preparation timing recognizing unit for detecting a preparation timing which is a prescribed distance and/or a prescribed time before said vehicle reaches said prescribed inspection position;

a terminal unit, which is connected to an electronic control unit mounted on said vehicle for controlling energization of said heater conductor, for sending an operation signal to said electronic control unit to energize said heater conductor;

an infrared camera for capturing an image of said glass panel of said vehicle which has reached said inspection position; and an inspection unit connected to said vehicle position recognizing unit, said preparation timing recognizing unit, and said terminal unit, for acquiring a thermal image from said infrared camera and inspecting said heater conductor for a wire disconnection based on said thermal image, wherein said inspection unit controls said terminal unit to start energizing said heater conductor when said preparation timing recognizing unit recognizes said preparation timing and acquires said thermal image from said infrared camera when said vehicle position recognizing unit recognizes the arrival of said vehicle at said inspection position.

7. A wire disconnection inspecting device according to claim 6, wherein said heater conductor comprises a circuit of a plurality of parallel lines extending in a predetermined direction on said glass panel; and wherein said inspection unit:

establishes an inspection window on said thermal image, said inspection window including a vehicle end and at least a portion of each of the parallel lines of said circuit;

generates projection data by projecting and adding temperature data in said inspection window per unit column in said predetermined direction;

counts the number of parallel lines of said circuit which are energized, from areas having said projection data equal to or higher than a threshold value; and if said number is smaller than a prescribed value, determines distances up to the areas having said projection data equal to or higher than said threshold value from an area representing said vehicle end of said projection data, and compares the distances with respective prescribed distances to determine a location where a wire disconnection has occurred.

* * * * *